US012052030B2

(12) United States Patent
Iqbal et al.

(10) Patent No.: US 12,052,030 B2
(45) Date of Patent: Jul. 30, 2024

(54) CIRCUIT STRUCTURE AND RELATED METHOD TO INDICATE VOLTAGE POLARITY VIA COMPARATOR

(71) Applicant: GlobalFoundries U.S. Inc., Malta, NY (US)

(72) Inventors: Asif Iqbal, Bangalore (IN); Sanmitra Bharat Naik, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 152 days.

(21) Appl. No.: 17/809,035

(22) Filed: Jun. 27, 2022

(65) Prior Publication Data

US 2023/0421168 A1 Dec. 28, 2023

(51) Int. Cl.
*H03M 1/12* (2006.01)
*H03K 5/24* (2006.01)
*H03M 1/66* (2006.01)

(52) U.S. Cl.
CPC .............. *H03M 1/662* (2013.01); *H03K 5/24* (2013.01)

(58) Field of Classification Search
CPC ........ H03M 1/462; H03M 1/468; H03M 1/46; H03M 1/12; H03M 1/466; H03M 1/00; H03M 1/069; H03M 1/0697; H03M 1/08; H03M 1/125; H03M 1/0678; H03M 1/1047; H03M 1/66; H03M 1/68; H03M 1/804;

(Continued)

(56) References Cited

U.S. PATENT DOCUMENTS 5,581,252 A * 12/1996 Thomas ................ H03M 1/466
 341/172
6,958,722 B1 * 10/2005 Janakiraman ......... H03M 1/144
 341/161

(Continued)

OTHER PUBLICATIONS

Chen et al., "A Low-Power Area-efficient Switching Scheme for Charge-sharing DACs in SAR ADCs," Proceeding of the Custom Integrated Circuits Conference, Sep. 2010, retrieved from: https://researchgate.net/publication/220910343 on Apr. 19, 2022, 5 pages.

(Continued)

*Primary Examiner* — Linh V Nguyen
(74) *Attorney, Agent, or Firm* — David Cain; Hoffman Warnick LLC

(57) ABSTRACT

Embodiments of the disclosure provide a circuit structure and method to indicate a differential voltage polarity using a comparator. The circuit structure includes a digital-to-analog converter (DAC) coupled to a positive differential voltage, a negative differential voltage, and a reference voltage. The DAC generates an output based on the positive differential voltage, the negative differential voltage, and the reference voltage. A comparator has a first input coupled to one of the DAC output and the positive differential voltage, and a second input coupled to one of the reference voltage and the negative differential voltage. A multiplexer array is coupled to the comparator and transmits one of: the positive differential voltage and the negative differential voltage to the comparator, causing the comparator to output a differential voltage polarity; and the DAC output and the reference voltage, causing the comparator to output an approximated bit for the DAC output.

19 Claims, 5 Drawing Sheets

(58) Field of Classification Search
CPC ........ H03M 1/001; H03M 1/002; H03M 1/06;
H03M 1/0607; H03M 1/0609; H03M
1/0612; H03M 1/0626; H03M 1/066;
H03M 1/0675; H03M 1/0682; H03M
1/0695; H03M 1/10; H03M 1/1009;
H03M 1/1014; H03M 1/1023; H03M
1/1033; H03M 1/1038; H03M 1/1042;
H03M 1/1061; H03M 1/109; H03M
1/1215; H03M 1/124; H03M 1/1245;
H03M 1/14; H03M 1/144; H03M 1/145;
H03M 1/164; H03M 1/38; H03M 1/40;
H03M 1/403; H03M 1/442; H03M 1/502;
H03M 1/662; H03M 3/398; H03M 3/46;
H03M 3/464; H03M 3/494; H03M 3/50
USPC .................................. 341/118–120, 155, 172
See application file for complete search history.

(56) References Cited

U.S. PATENT DOCUMENTS

| | | | | |
|---|---|---|---|---|
| 7,439,898 | B1* | 10/2008 | Nittala | H03M 1/462 |
| | | | | 341/163 |
| 8,587,465 | B2* | 11/2013 | Chen | H03M 1/0663 |
| | | | | 341/161 |
| 9,325,337 | B1* | 4/2016 | Dempsey | H03M 1/109 |
| 9,455,733 | B1* | 9/2016 | Wu | H03M 1/0609 |
| 9,520,891 | B1* | 12/2016 | Kull | H03M 1/08 |
| 9,685,972 | B1* | 6/2017 | Xun | H03K 19/21 |
| 9,954,549 | B2 | 4/2018 | Venca et al. | |
| 10,903,846 | B1* | 1/2021 | Liu | H03M 1/0678 |
| 11,239,856 | B1* | 2/2022 | Innocent | H04N 25/75 |
| 2015/0263755 | A1* | 9/2015 | Confalonieri | H03M 1/1023 |
| | | | | 341/120 |
| 2019/0166325 | A1* | 5/2019 | Kim | H03M 1/466 |
| 2020/0021280 | A1* | 1/2020 | Miller | H03K 5/24 |
| 2023/0361780 | A1* | 11/2023 | Berens | H03M 1/468 |

OTHER PUBLICATIONS

Caselli et al., "Charge Sharing and Charge Injection A/D Converters for Analog In-Memory Computing," 2021 19th IEEE International New Circuits and Systems Conference, 4 pages.

Craninckx et al., "A 65J/Conversion-Step 0-to-50MS/s 0-to-0.7mW 9b Charge-Sharing SAR ADC in 90nm Digital CMOS," Feb. 13, 2007 IEEE International Solid-State Circuits Conference, 246-247 pp.

Tsai et al., "A 1-V-0.6-V 9b 1.5-MS/s Reference-Free Charge-Sharing SAR ADC for Wireless-Powered Implantable Telemetry," IEEE Transactions on Circuits and Systems—II: Express Briefs, vol. 61, No. 11, Nov. 2014, 825-829 pp.

* cited by examiner

CIRCUIT STRUCTURE AND RELATED METHOD TO INDICATE VOLTAGE POLARITY VIA COMPARATOR

BACKGROUND

1. Technical Field

The present disclosure provides a circuit structure and related method for indicating a voltage polarity via a comparator.

2. Background Art

Many integrated circuit (IC) architectures include components for processing of analog input voltages, e.g., in the form of differential input voltages having positive and negative components to be processed. Differential input voltages carry more information than other types of inputs but may require significant additional processing hardware. In the example of an analog-to-digital (ADC) converter, the positive and negative differential input components are typically processed by way of respective digital-to-analog (DAC) converter blocks for comparing converted digital bits with the sampled analog voltages. Other circuits similarly may include duplicate hardware for processing of positive and negative input voltages. Such hardware occupies significant surface area.

SUMMARY

The illustrative aspects of the present disclosure are designed to solve the problems herein described and/or other problems not discussed.

Embodiments of the disclosure provide a circuit structure including: a digital-to-analog converter (DAC) coupled to a positive differential voltage, a negative differential voltage, and a reference voltage, wherein the DAC generates an output based on the positive differential voltage, the negative differential voltage, and the reference voltage; a comparator having a first input coupled to one of the DAC output and the positive differential voltage, and a second input coupled to one of the reference voltage and the negative differential voltage; and a multiplexer array coupled to the comparator and configured to, in response to a sampling signal transmitted from a control logic to the DAC and the multiplexer array, select one of: the positive differential voltage and the negative differential voltage for transmission to the comparator, causing the comparator to output a differential voltage polarity; and the DAC output and the reference voltage for transmission to the comparator, causing the comparator to output an approximated bit for the DAC output.

Other embodiments of the disclosure provide a circuit structure including: a digital-to-analog converter (DAC) coupled to a positive differential voltage, a negative differential voltage, and a reference voltage, wherein the DAC generates an output based on the positive differential voltage, the negative differential voltage, and the reference voltage; a comparator having a first input coupled to one of the DAC output and the positive differential voltage, and a second input coupled to one of the reference voltage and the negative differential voltage; a multiplexer array coupled to the comparator and configured to, in response to a sampling signal transmitted from a control logic to the DAC and the multiplexer array, select one of: the positive differential voltage and the negative differential voltage for transmission to the comparator, causing the comparator to output a differential voltage polarity; and the DAC output and the reference voltage for transmission to the comparator, causing the comparator to output an approximated bit for the DAC output; and a successive approximation register (SAR) logic having a set of inputs coupled to the output of the comparator, wherein the SAR logic is coupled to the DAC to approximate a set of additional bits based on the approximated bit and the differential voltage polarity.

Additional embodiments of the disclosure provide a method for converting differential input voltages into a digital output, the method including: generating an output via a DAC based on a set of inputs including a positive differential voltage, a negative differential voltage, and a reference voltage; and transmitting a sampling signal to the DAC and a multiplexer array coupled between the DAC and a comparator, wherein the sampling signal causes the multiplexer array to select one of: the positive differential voltage and the negative differential voltage for transmission to the comparator, causing the comparator to output a differential voltage polarity; and the DAC output and the reference voltage for transmission to the comparator, causing the comparator to output an approximated bit for the DAC output.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
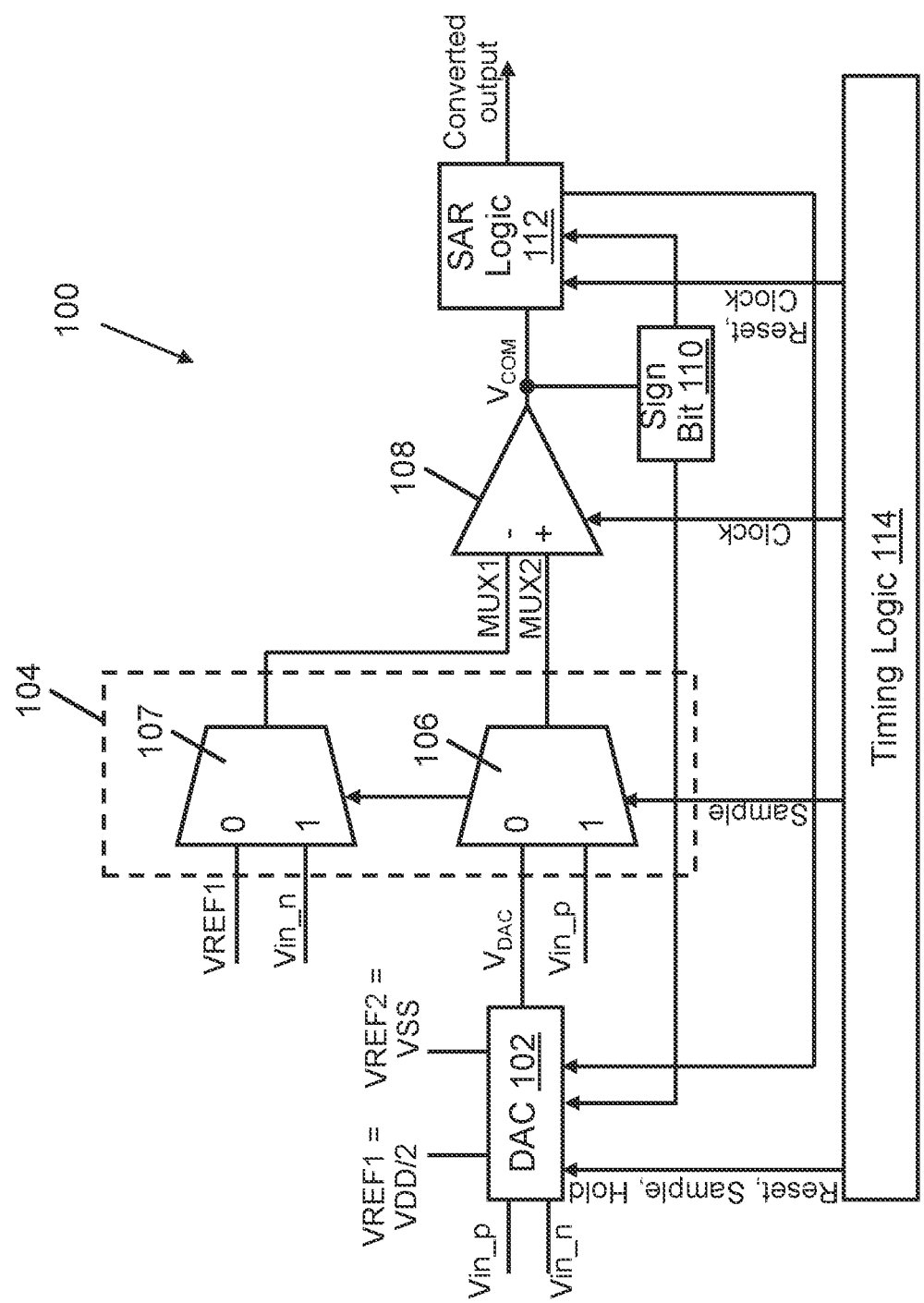
FIG. 1 shows a schematic view of a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a circuit structure for indicating the voltage polarity of an approximated voltage, using a comparator otherwise configured for approximating digital bits. The circuit structure includes a digital-to-analog converter (DAC) coupled to a positive differential voltage, a negative differential voltage, and a reference voltage. These voltages are provided as inputs to the DAC, such that the DAC may generate a converted analog voltage based on the positive differential voltage, the negative differential voltage, and the reference voltage. The reference voltage drives operation of the DAC, whereas the positive and negative differential voltages are both converted into an analog (i.e., non-digital) voltage output corresponding to their magnitude(s).

A comparator has one input coupled to the DAC output or the positive differential voltage, and another input coupled to the reference voltage or the negative differential voltage. A multiplexer array is coupled to the comparator to select which input(s) are transmitted to the comparator, e.g., based on a sample signal that is also used to control the DAC. When the sampling signal is active, the multiplexer array transmits the positive differential voltage and the negative differential voltage to the comparator to output a differential voltage polarity. When the sampling signal is not active, the multiplexer array instead transmits the DAC output and reference voltage to the comparator, causing it to output an approximated bit for the DAC output.

Referring to FIG. 1, a schematic view of a circuit structure (simply "structure" hereafter) 100 is shown according to embodiments of the disclosure. Circuit 100 may define, and/or may be configured for operation with, a successive approximation register (SAR) circuit for converting detected voltages into digital words indicative of the voltage magnitude and/or polarity. An SAR circuit including circuit 100 may operate by detecting incoming voltages (expressed, e.g., as a differential voltage having positive and negative components), which then may be compared with a reference voltage in one or more stages. At each stage, structure 100 may generate a "one" or "high" bit if the incoming voltage exceeds the reference voltage or may generate a "zero" or "low" bit if the incoming voltage does not exceed the reference voltage. This process may repeat for each successive bit to generate a digital word (i.e., a signal having multiple bits) representing the approximated digital value of an incoming analog voltage.

Circuit 100 may be coupled to two differential input voltages: a positive differential voltage Vin_p and a negative differential input voltage Vin_n, each corresponding to a positive and negative component of the incoming analog voltage. Each differential input voltage may be transmitted to a digital-to-analog converter ("DAC"). DAC 102 additionally may be coupled to a set of reference voltages indicated, e.g., VREF1 and VREF2, respectively. Reference voltages VREF1 and VREF2 may be of different magnitude. For example, the magnitude of first reference voltage VREF1 may be greater than the magnitude of VREF2. More specifically, second reference voltage VREF1 may be approximately half of a drain voltage supplied to circuit 100 (i.e., "VDD/2") whereas first reference voltage VREF2 to may be set to a value of a source voltage supplied to circuit 100 (i.e., "VSS"). DAC 102 may also receive signal inputs provided from other components of circuit 100 as discussed herein. DAC 102 may use first reference voltage VREF1 and/or second reference voltage VREF2 to electrically convert the incoming differential voltages Vin_p, Vin_n into an analog voltage ($V_{DAC}$) that is output from DAC 102.

Circuit 100 may include a multiplexer array 104 (i.e., two or more interconnected multiplexers) for transmitting a selected pair of voltages to a comparator 108 of circuit 100. A first multiplexer 106 of multiplexer array 104 may have one input line for receiving output $V_{DAC}$ from DAC 102, and another input line that is coupled to positive differential voltage Vin_p. A second multiplexer 107 of multiplexer array 104 may have one input line that is coupled to a reference voltage (e.g., first reference voltage VREF1 set to VDD/2 as shown by example in FIG. 1) and another input line that is coupled to negative differential voltage Vin_n. The output from first multiplexer 106 (MUX1) may be coupled to one input node of comparator 108, and the output from second multiplexer 107 (MUX2) may be coupled to the other input node of comparator 108. Comparator 108 may include any currently known or later developed circuitry for producing an output signal indicating whether one of the two input voltages (e.g., MUX1) is greater than or less than the other input voltage (e.g., MUX2). Comparator 108 thus may indicate whether positive differential voltage Vin_p is larger than negative differential voltage Vin_n, or whether the output from DAC 102 is larger than first reference voltage VREF1. The operation of comparator 108 may not depend on the types of signals selected for transmission as voltages MUX1, MUX2, but the significance of the signals produced from comparator 108 may depend on which signals are transmitted to comparator 108 via multiplexer array 104. The combination of signals to be transmitted to comparator 108 may be selected via a timing logic 114 coupled to multiplexer array 104, as discussed in more detail elsewhere herein.

Comparator 108 may output two types of voltages as a comparator output ($V_{COM}$), based on the pair of signals transmitted to the input nodes of comparator 108. In the case where multiplexer array 104 transmits DAC output $V_{DAC}$ and reference voltage VREF1 to comparator 108, comparator output $V_{COM}$ denotes whether the converted analog voltage is greater than reference voltage VREF1, e.g., for successive digital approximation of the differential input voltages. In the case where multiplexer array 104 transmits positive differential voltage Vin_p and negative differential voltage Vin_n to comparator 108, comparator output $V_{COM}$ simply indicates the polarity of the differential input voltage, i.e., whether Vin_p is larger or smaller than Vin_n. To temporarily store the input voltage polarity, circuit 100 may include a sign bit latch (simply "sign bit" in FIG. 1) 110 for temporarily storing a "zero" or "one" bit corresponding to positive and negative polarities and/or for subsequent transmission to DAC 102 and successive approximation register (SAR) logic 112.

Sign bit latch 110 may couple comparator output $V_{COM}$ to one multiplexer (e.g., first multiplexer 106) of multiplexer array 104 and SAR logic 112 in circuit 100. During operation, an output from comparator 108 indicating the voltage polarity of differential voltages Vin_p, Vin_n may be transmitted to sign bit latch 110 before being transmitted to multiplexer array 104 and/or SAR logic 112. Sign bit latch 110 may transmit the voltage polarity to DAC 102, e.g., such that subsequent approximated bits include the voltage polarity transmitted to sign bit latch 110. Sign bit latch 110 similarly may transmit the voltage polarity to SAR logic 112, e.g., such that a digital word representing the approximated digital bit includes one bit (e.g., a most significant bit) indicating the voltage polarity.

Circuit 100 may include SAR logic 112 coupled to the output of comparator 108, as well as sign bit latch 110, to generate digital words (i.e., multiple bits constituting one item of data). To operate SAR logic 112, timing logic 114 of circuit 100 may transmit a clock signal to comparator 108 and SAR logic 112 to repeatedly sample and compare differential voltages Vin_p, Vin_n and generate one or more approximated digital bits. During operation, timing logic 112 may transmit a sampling signal to DAC 102 and multiplexer array 104, which causes multiplexer array 104 to transmit the pair of differential voltages Vin_p, Vin_n, or the pair of DAC 102 output $V_{DAC}$ and first reference voltage VREF1 to comparator 108. SAR logic 112 and timing logic 114 thus each may include logic gates (e.g., combinations of transistors producing fundamental logic functions including inverters, "or" gates, "and" gates, "exclusive and," "exclusive or," etc.) Timing logic 114 may control the operation of several components within circuit 100 by transmitting various signals thereto. Timing logic 114 thus may be coupled to DAC 102, multiplexer array 104, comparator 108, and/or SAR logic 112. Timing logic 114 may transmit a sampling signal ("sample") to DAC 102 and multiplexer array 104 to control whether DAC 102 and multiplexer array 104 transmit differential voltages Vin_p, Vin_n to comparator 108 to output the voltage polarity from comparator 108 or transmit DAC output $V_{DAC}$ and reference voltage VREF1 to comparator 108 to output an approximated digital bit. Timing logic 114 may transmit a clock signal ("clock") to comparator 108 and SAR logic 112 to control the speed at which comparator 108 and SAR logic 112 process incoming signals from multiplexer array 104. Timing logic 114 additionally may transmit a hold signal ("hold") to DAC 102 to connect DAC 102 appropriately from sign bit latch 110 and/or SAR logic 112. Timing logic 114 also may transmit a reset signal ("reset") to DAC 102 and/or SAR logic 112 to remove any data (including voltage polarity, approximated bits, etc.) stored therein before transmitting a new sampling signal, thereby allowing circuit 100 to process additional inputs.

Figure 2:
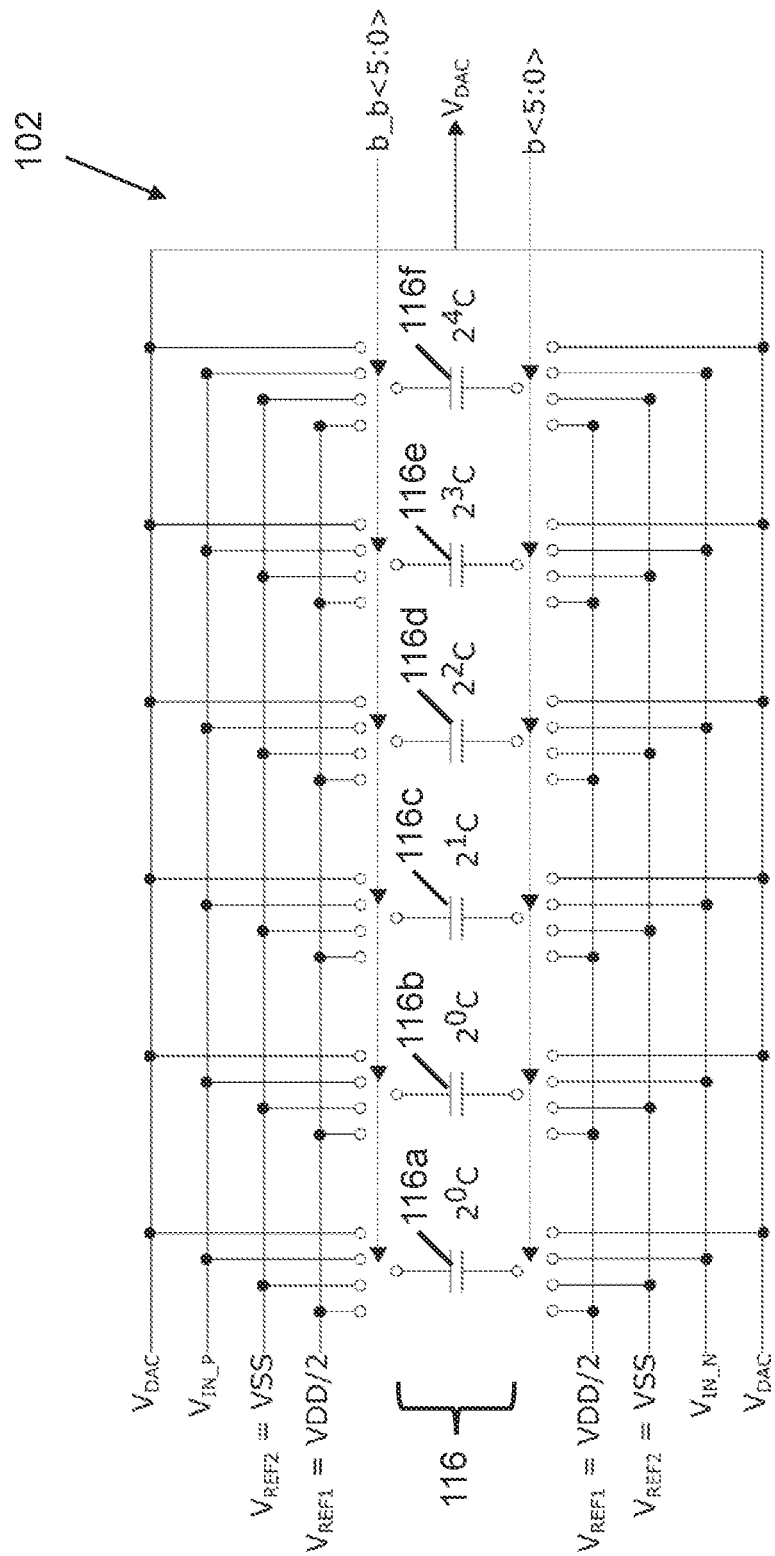
FIG. 2 shows an expanded schematic diagram of a digital to analog converter (DAC) in a circuit structure according to embodiments of the disclosure.

Turning to FIG. 2, DAC 102 in some embodiments may include a plurality of capacitors 116, connected in parallel with each other between, e.g., five electrical inputs to DAC 102. Capacitors 116 in DAC 102 each may couple one or more of VREF1, VREF2, Vin_p, Vin_n, and/or the output voltage $V_{DAC}$ to the output node of DAC 102. According to an example, capacitors 116 may include six capacitors having binary increasing capacitances, e.g., a first capacitor 116a and a second capacitor 116b having a capacitance of C (denoted "2⁰ C." to indicate the logarithmic relationship with other capacitors of DAC 102). Capacitance C may be any desired amount of capacitance. A third capacitor 116c may have a capacitance of twice C (denoted "$2^1C$" to indicate the logarithmic relationship with other capacitors of DAC 102). Each additional capacitor of DAC 102 may have an exponentially larger capacitance relative to capacitance C, e.g., fourth capacitor 116d may have a capacitance of four times C ("$2^2C$"), fifth capacitor 116e may have a capacitance of eight times C ("$2^3C$"), sixth capacitor 116f may have a capacitance of sixteen times C ("$2^4C$").

The parallel coupling of capacitors 116 may enable charge sharing across capacitors 116 regardless of which input and output nodes are coupled together through DAC 102. Charge sharing refers to the equivalent capacitance of multiple capacitors being equal to the sum of all capacitors coupled in parallel, as compared with a reduction in capacitance which would arise from multiple capacitors being coupled together in series. As also shown in FIG. 2, a set of signaling lines b and b_b may receive converted digital bits from SAR 112 (FIG. 1), such that the sampling signal couples one or more inputs to DAC 102 to its output $V_{DAC}$ through capacitors 116. The digital bits from timing logic 114 may be transmitted as a five bit digital word ("<5:0>" in FIG. 2) representing which, if any, of the voltage lines will be coupled together through capacitors 116. In this case, each bit of the sampling signal may correspond to a respective voltage input or output (e.g., VREF1, VREF2, Vin_p, Vin_n, $V_{DAC}$) transmitted to DAC 102.

Figure 3:
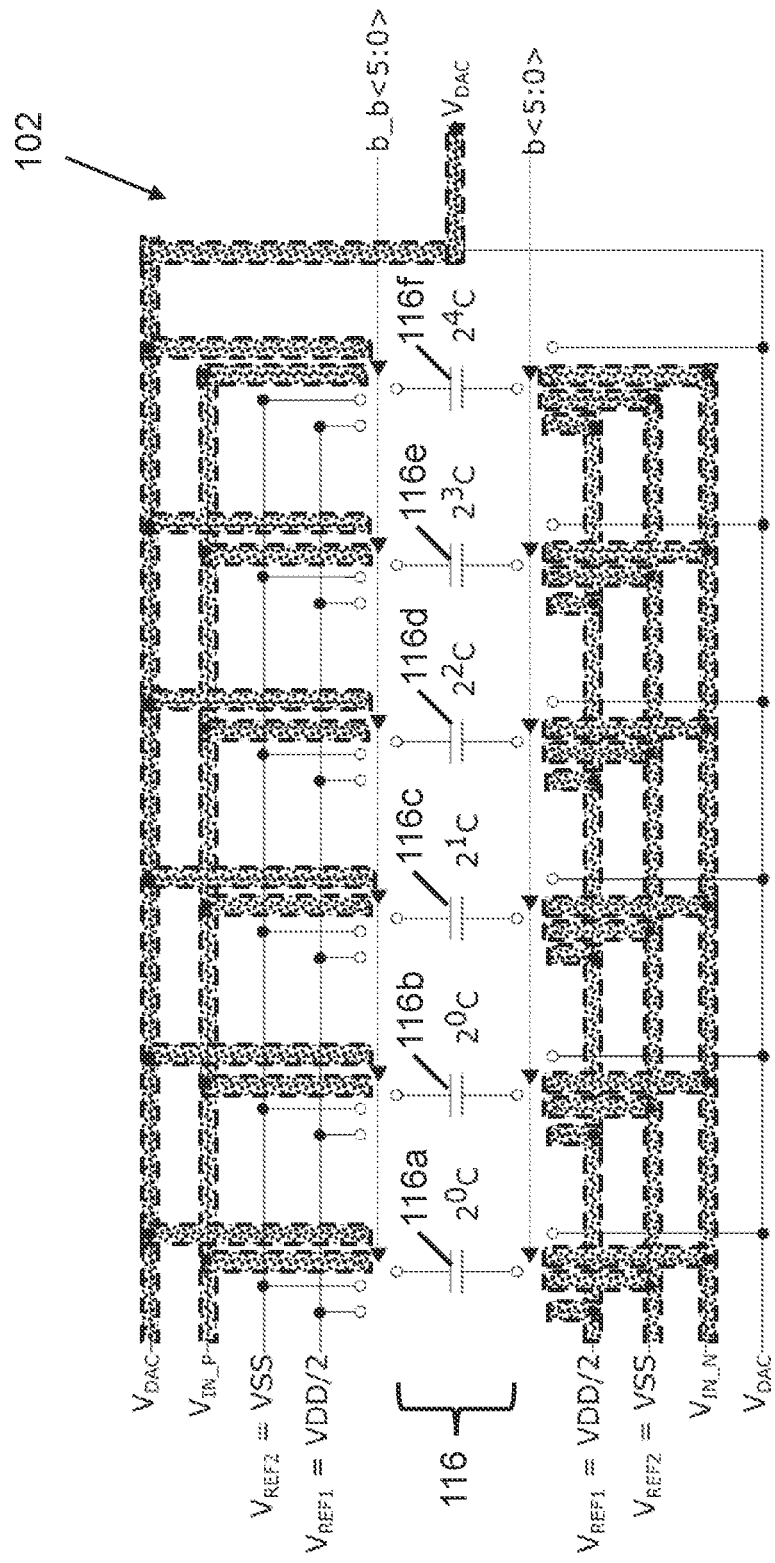
FIG. 3 shows an annotated schematic diagram of a DAC in a circuit structure to indicate signal pathways during operation according to embodiments of the disclosure.
Figure 4:
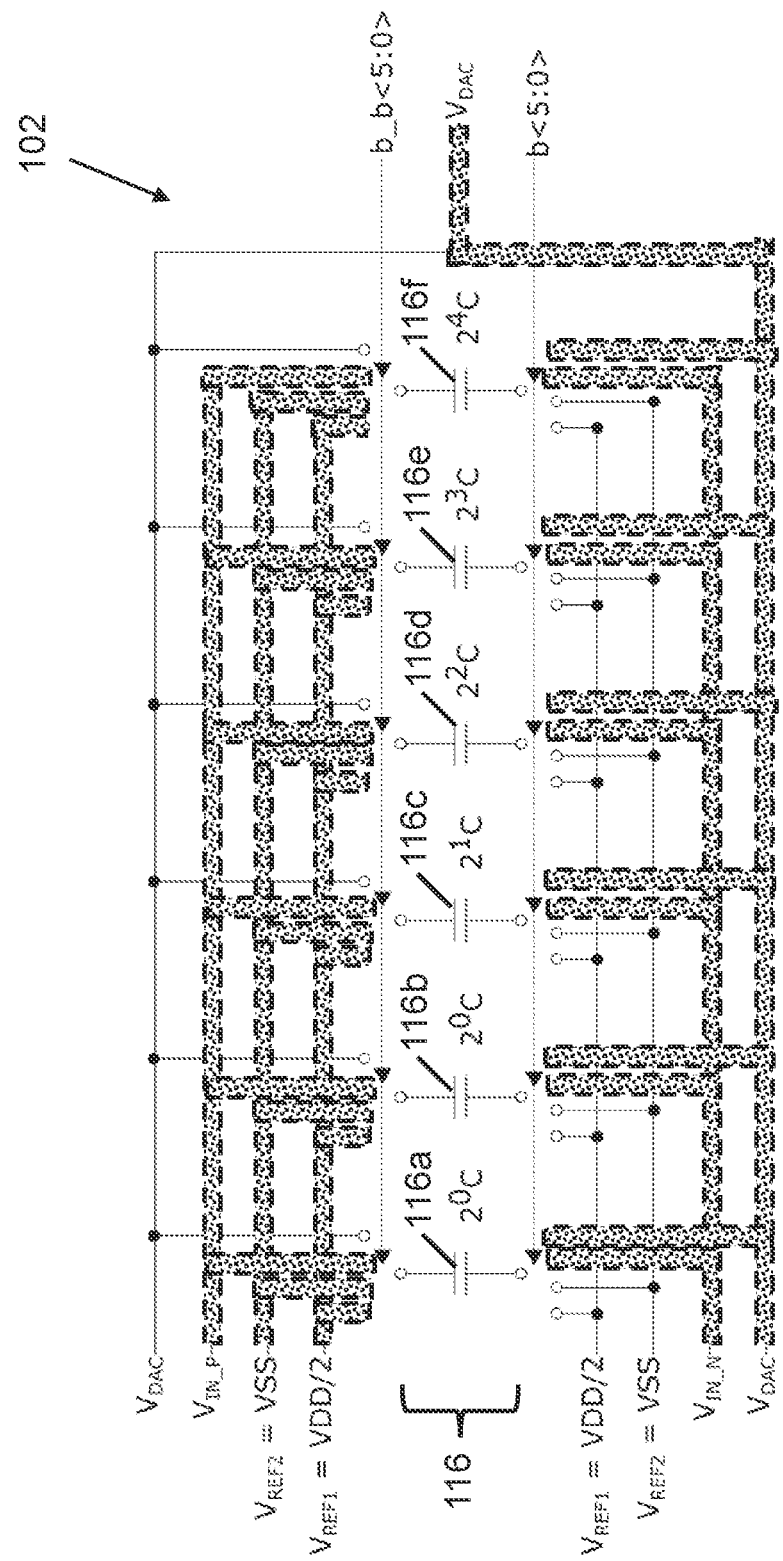
FIG. 4 shows an annotated schematic diagram of a DAC in a circuit structure indicating opposite polarity signal pathways according to embodiments of the disclosure.

FIGS. 3 and 4 each provide an annotated schematic diagram of DAC 102 illustrating a possible coupling of inputs to output $V_{DAC}$ during operation at respective polarities. FIG. 3 depicts operation for a positive voltage polarity, whereas FIG. 4 depicts operation for a negative voltage polarity. According to an example, signaling lines b and b_b transmit a five bit digital word to each of capacitors 116a-116f. Each bit transmitted via lines b and b_b may connect or disconnect capacitors 116 of DAC 102 to respective nodes, based on whether the positive voltage polarity is greater than the negative voltage polarity. For example, DAC 102 initially may couple differential input voltages Vin_p, Vin_n to DAC output $V_{DAC}$ to determine whether the input voltage has a positive or negative polarity. FIG. 3 depicts a scenario where the input voltage is positive, such that each capacitor 116 couples reference voltages VREF1, VREF2 to one set of capacitor plates and $V_{DAC}$ to the opposite set of capacitor plates. FIG. 4, by comparison, depicts a negative input voltage such that each capacitor 116 couples reference voltages VREF1, VREF2 to one set of capacitor plates and $V_{DAC}$ to the other set of plates. In each case, the sampling signal is also transmitted to multiplexer array 104 (FIG. 1) to cause signals $V_{DAC}$ and VREF1 to pass to comparator 108 (FIG. 1). To instead generate a voltage polarity of differential voltages Vin_n, Vin_p, the sampling signal delivered through lines b and b_b may couple a different set of input signals to the output line $V_{DAC}$.

Figure 5:
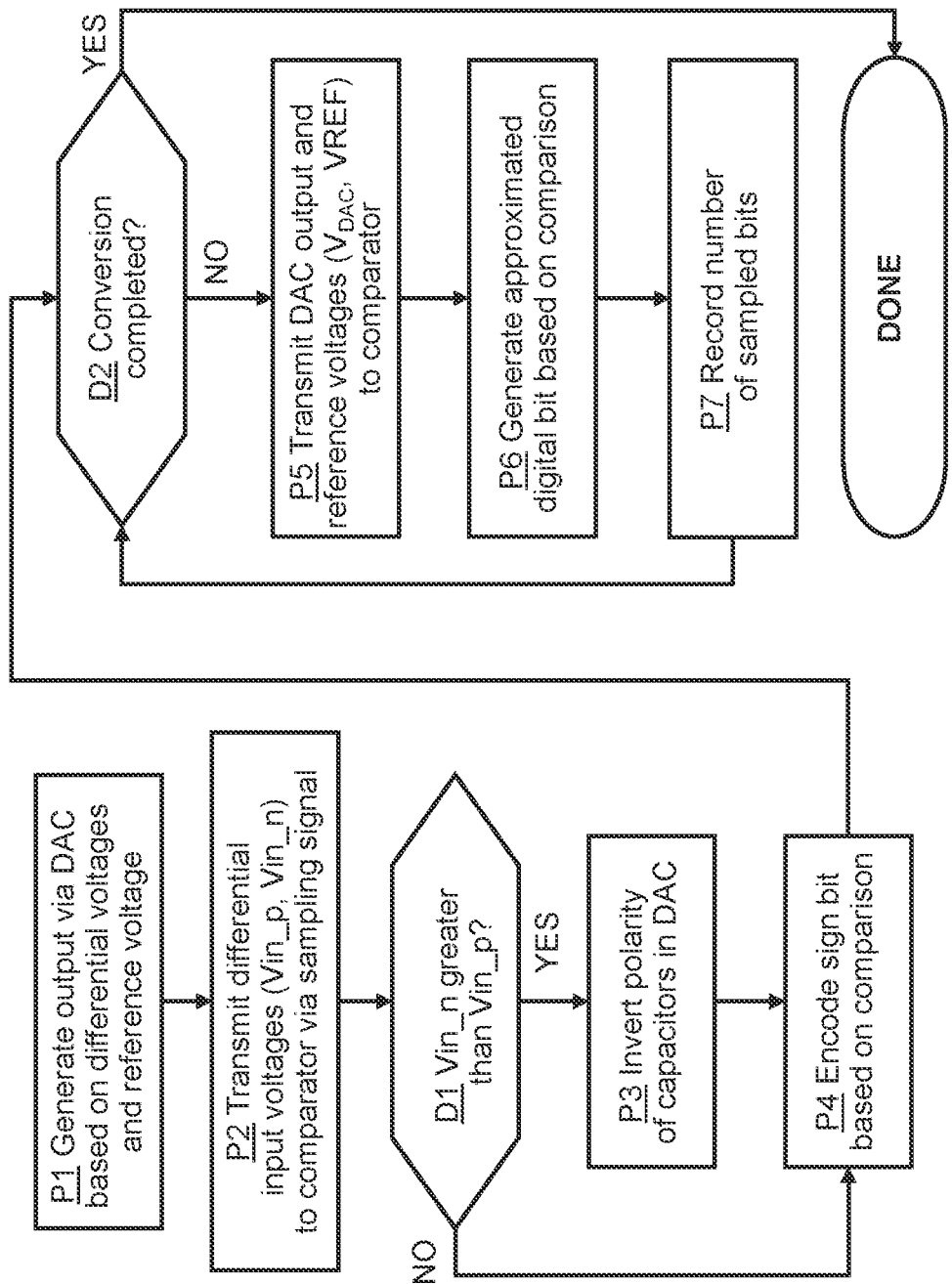
FIG. 5 shows an illustrative flow diagram for operating a circuit structure according to embodiments of the disclosure.

Referring now to FIGS. 1 and 5, embodiments of the disclosure provide methods to indicate a voltage polarity using circuit 100 including comparator 108, e.g., for successive approximation of digital bits based on an incoming analog voltage. Process P1 includes generating DAC output $V_{DAC}$ from DAC 102 by transmitting differential input voltages Vin_p, Vin_n and reference voltage(s) VREF1, VREF2. As discussed elsewhere herein, process P1 may include concurrently transmitting a sampling signal to DAC 102 via timing logic 114 coupled thereto.

Methods of the disclosure include process P2 of using multiplexer array 104 to transmit differential input voltages Vin_p, Vin_n to comparator 108 in response to a sampling signal transmitted concurrently to DAC 102 and multiplexer array 104. During operation, the sampling signal transmitted to multiplexer array 104 may cause multiplexers 106, 107 therein to transmit differential input voltages Vin_p, Vin_n to comparator 108 instead of DAC output $V_{DAC}$ and reference voltage VREF1.

At decision D1, comparator 108 will evaluate whether negative differential voltage Vin_n is greater than positive differential voltage Vin_p. Where negative differential voltage Vin_n is larger than positive differential voltage Vin_p (i.e., "Yes" at decision D1), comparator output $V_{COM}$ will be set to a corresponding bit (e.g., logic level high to indicate a yes) to sign bit latch 110 and SAR logic 112. In process P3, the logic level of comparator output $V_{COM}$ will cause SAR logic 112 to transmit a corresponding voltage to DAC 102 to invert the polarity of capacitors 116 (FIGS. 2, 3) therein. Inverting the polarity of capacitors 116 by applying an inverse voltage to DAC 102 allows the same set of capacitors 116 to process positive and negative voltages input to DAC 102, as compared to conventional devices requiring multiple sets of capacitors. In process P4, sign bit latch 110 additionally stores the logic level of comparator output $V_{COM}$ for inclusion in a subsequently transmitted digital word encoding the approximated digital voltage. Where negative differential voltage Vin_n is not larger than positive differential voltage Vin_p (i.e., "No" at decision D1), comparator output $V_{COM}$ will be set to a corresponding bit (e.g., logic level low to indicate a no) to sign bit latch 110 and SAR logic 112. In this case, process P3 does not occur and SAR logic 112 does not invert the polarity of capacitors 116 in DAC 102.

Next, SAR logic 112 determines whether one or more approximated digital bits can be approximated for the input voltage transmitted to circuit 100. In the case where at least one digital bit must be converted (e.g., upon completing process P4), SAR logic 112 determines that the sample, hold, and conversion (simply "conversion" hereafter) cycle is not completed. When conversion is not completed (i.e., "No" at decision D2) the method may continue to process P5 of causing timing logic 114 to adjust its sampling signal, in turn causing multiplexer array 104 to transmit DAC output $V_{DAC}$ and reference voltage VREF1 to comparator 108. In process P6, comparator 108 will compare whether the converted digital voltage of DAC output $V_{DAC}$ is larger than the corresponding reference voltage and generate comparator output $V_{COM}$ as a one or a zero based on the comparison. Thereafter, process P7 includes SAR logic 112 recording the number of sampled bits (e.g., by increasing a register value within SAR logic 112). The method may then return to decision D2, and processes P5-P7 may repeat for each pair of additional negative differential voltages and positive differential voltages. When SAR logic 112 determines that the conversion cycle is completed (i.e., "Yes" at decision D2), the method may conclude ("Done"), and circuit 100 may cease operation. In some cases, timing logic 114 may transmit a "hold" signal to DAC 102 to reverse the polarity of capacitors therein, e.g., as shown by the comparison between FIGS. 3 and 4 discussed herein.

Embodiments of the disclosure may provide several technical advantages, examples of which are discussed herein. For example, embodiments of circuit 100 implement a single set of capacitors 116 within DAC 102 for processing of positive and negative differential voltages. The use of capacitors 116 to process all voltage polarities, in turn, causes circuit 100 to occupy less surface area than conventional analog to digital voltage converters and/or SAR analog-digital conversion (ADC) circuits. The processing paradigms discussed herein are achievable, e.g., by including sign bit latch 110 to encode the voltage polarity as an additional digital bit, and multiplexer array 104 to transmit differential voltages to comparator 108 or successive outputs from DAC 102.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit structure comprising:
a digital-to-analog converter (DAC) coupled to a positive differential voltage, a negative differential voltage, and a reference voltage, wherein the DAC generates an output based on the positive differential voltage, the negative differential voltage, and the reference voltage;
a comparator having a first input coupled to one of the DAC output and the positive differential voltage, and a second input coupled to one of the reference voltage and the negative differential voltage;
a multiplexer array coupled to the comparator and configured to, in response to a sampling signal transmitted from a control logic to the DAC and the multiplexer array, select one of:
the positive differential voltage and the negative differential voltage for transmission to the comparator, causing the comparator to output a differential voltage polarity indicating which of the positive differential voltage and the negative differential voltage is larger;
the DAC output and the reference voltage for transmission to the comparator, causing the comparator to output an approximated bit for the DAC output; and
a sign bit latch for storing the differential voltage polarity, wherein the sign bit latch is coupled to the DAC and a successive approximation register (SAR) logic to transmit the differential voltage polarity to the DAC and the SAR logic.

2. The circuit structure of claim 1, wherein the control logic is coupled to an output of the comparator and configured to encode the differential voltage polarity as an additional bit for the approximated bit.

3. The circuit structure of claim 1, wherein the sampling signal couples one of the positive differential voltage, the negative differential voltage, and the reference voltage to the multiplexer array through a subset of a plurality of capacitors within the DAC.

4. The circuit structure of claim 3, wherein the DAC is configured to invert a voltage polarity of the plurality of capacitors based on the differential voltage polarity.

5. The circuit structure of claim 1, wherein the SAR logic is coupled to the comparator, and wherein the SAR logic is coupled to the DAC to approximate a set of additional bits based on the approximated bit.

6. The circuit structure of claim 1, wherein the multiplexer array includes:

a first multiplexer coupled to the DAC and the positive differential voltage; and
a second multiplexer coupled to the reference voltage and the negative differential voltage, wherein the second multiplexer is not coupled to the DAC.

7. A circuit structure comprising:
a digital-to-analog converter (DAC) coupled to a positive differential voltage, a negative differential voltage, and a reference voltage, wherein the DAC generates an output based on the positive differential voltage, the negative differential voltage, and the reference voltage;
a comparator having a first input coupled to one of the DAC output and the positive differential voltage, and a second input coupled to one of the reference voltage and the negative differential voltage;
a multiplexer array coupled to the comparator and configured to, in response to a sampling signal transmitted from a control logic to the DAC and the multiplexer array, select one of:
the positive differential voltage and the negative differential voltage for transmission to the comparator, causing the comparator to output a differential voltage polarity indicating which of the positive differential voltage and the negative differential voltage is larger; and
the DAC output and the reference voltage for transmission to the comparator, causing the comparator to output an approximated bit for the DAC output;
a successive approximation register (SAR) logic having a set of inputs coupled to the output of the comparator, wherein the SAR logic is coupled to the DAC to approximate a set of additional bits based on the approximated bit and the differential voltage polarity; and
a sign bit latch for storing the differential voltage polarity, wherein the sign bit latch is coupled to the DAC and the SAR logic to transmit the differential voltage polarity to the DAC and the SAR logic.

8. The circuit structure of claim 7, wherein the control logic is coupled to an output of the comparator and configured to encode the differential voltage polarity as an additional bit for the approximated bit.

9. The circuit structure of claim 7, wherein the comparator is coupled to the DAC to transmit the differential voltage polarity to the DAC.

10. The circuit structure of claim 7, wherein the sampling signal couples one of the positive differential voltage, the negative differential voltage, and the reference voltage to the multiplexer array through a subset of a plurality of capacitors within the DAC.

11. The circuit structure of claim 10, wherein the DAC is configured to invert a voltage polarity of the plurality of capacitors based on the differential voltage polarity.

12. The circuit structure of claim 7, wherein the SAR logic includes an output for transmitting the differential voltage polarity, the approximated bit, and the set of additional bits as a digital word.

13. The circuit structure of claim 7, wherein the multiplexer array includes:
a first multiplexer coupled to the DAC and the positive differential voltage; and
a second multiplexer coupled to the reference voltage and the negative differential voltage, wherein the second multiplexer is not coupled to the DAC.

14. A method for converting differential input voltages into a digital output, the method comprising:

generating an output via a DAC based on a set of inputs including a positive differential voltage, a negative differential voltage, and a reference voltage;

transmitting a sampling signal to the DAC and a multiplexer array coupled between the DAC and a comparator, wherein the sampling signal causes the multiplexer array to select one of:
- the positive differential voltage and the negative differential voltage for transmission to the comparator, causing the comparator to output a differential voltage polarity indicating which of the positive differential voltage and the negative differential voltage is larger; and
- the DAC output and the reference voltage for transmission to the comparator, causing the comparator to output an approximated bit for the DAC output;

storing the differential voltage polarity in sign bit latch, wherein the sign bit latch is coupled to the DAC and a successive approximation register (SAR) logic; and transmitting the differential voltage polarity from the sign bit latch to the DAC and the SAR logic.

15. The method of claim 14, further comprising encoding the differential voltage polarity as an additional bit for the approximated bit.

16. The method of claim 14, wherein the sampling signal couples one of the positive differential voltage, the negative differential voltage, and the reference voltage to the multiplexer array through a subset of a plurality of capacitors within the DAC.

17. The method of claim 16, further comprising inverting a voltage polarity of the plurality of capacitors within the DAC based on the differential voltage polarity.

18. The method of claim 14, wherein the sampling signal further causes the DAC to sample an additional positive differential voltage and an additional negative differential voltage.

19. The method of claim 14, further comprising approximating a set of additional bits based on the approximated bit and the differential voltage polarity.

* * * * *